(12) United States Patent
Wang et al.

(10) Patent No.: US 9,889,528 B2
(45) Date of Patent: Feb. 13, 2018

(54) INFRARED VISION SENSING DETECTION METHOD AND DEVICE FOR NARROW-GAP WELD SEAM DEVIATION

(71) Applicant: JIANGSU UNIVERSITY OF SCIENCE AND TECHNOLOGY, Jiangsu (CN)

(72) Inventors: Jiayou Wang, Jiangsu (CN); Jie Zhu, Jiangsu (CN); Cai Zhang, Jiangsu (CN); Maosen Yang, Jiangsu (CN); Na Su, Jiangsu (CN); Wenhang Li, Jiangsu (CN)

(73) Assignee: JIANGSU UNIVERSITY OF SCIENCE AND TECHNOLOGY, Jiangsu (CN)

( * ) Notice: Subject to any disclaimer, the term of this patent is extended or adjusted under 35 U.S.C. 154(b) by 0 days.

(21) Appl. No.: 15/541,021

(22) PCT Filed: Dec. 16, 2015

(86) PCT No.: PCT/CN2015/097552
§ 371 (c)(1),
(2) Date: Sep. 26, 2017

(87) PCT Pub. No.: WO2016/107408
PCT Pub. Date: Jul. 7, 2016

(65) Prior Publication Data
US 2018/0015571 A1    Jan. 18, 2018

(30) Foreign Application Priority Data
Dec. 30, 2014 (CN) .......................... 2014 1 0833371

(51) Int. Cl.
*G06K 9/00* (2006.01)
*B23K 31/12* (2006.01)
(Continued)

(52) U.S. Cl.
CPC .......... *B23K 31/125* (2013.01); *G01B 11/022* (2013.01); *G01B 11/14* (2013.01);
(Continued)

(58) Field of Classification Search
None
See application file for complete search history.

(56) References Cited

U.S. PATENT DOCUMENTS 3,532,807 A * 10/1970 Wall, Jr. ............... B23K 9/1274
219/124.34
4,001,497 A * 1/1977 Bosworth ............ B23K 11/252
348/90
(Continued)

FOREIGN PATENT DOCUMENTS

CN        102814574        12/2012
CN        102814574 A   *  12/2012
(Continued)

*Primary Examiner* — Jayesh A Patel
(74) *Attorney, Agent, or Firm* — JCIPRNET

(57) ABSTRACT

An infrared vision sensing detection method and device for narrow-gap weld seam deviation are provided. The device includes a shaking (or rotating) arc narrow-gap welding torch, an arc current sensor, a computer image processing system, and an infrared photographing system. The infrared photographing system includes an infrared camera which acquires an infrared image of a welding region in an external triggering manner when an arc shakes (or rotates) to a position closest to the left side wall or right side wall of a groove. After computer image processing, a welding wire position and a groove edge information is extracted in real time, and a weld seam deviation is calculated according to position changes of a welding wire relative to the left side wall and the right side wall of the groove, and the weld seam deviation is output. During pulsed arc welding, a signal in a base value period of the arc current pulse is detected by using the current sensor, thereby realizing welding image acquisition synchronized with the base value current period of the pulsed arc.

11 Claims, 9 Drawing Sheets

(51) Int. Cl.
*G01B 11/02* (2006.01)
*G01B 11/14* (2006.01)
*G06T 7/00* (2017.01)
*G06T 7/13* (2017.01)
*G06T 7/73* (2017.01)
*G06T 7/155* (2017.01)
*G06T 7/136* (2017.01)
*G01R 19/00* (2006.01)

(52) U.S. Cl.
CPC .............. *G06T 7/0004* (2013.01); *G06T 7/13* (2017.01); *G06T 7/136* (2017.01); *G06T 7/155* (2017.01); *G06T 7/73* (2017.01); *G01R 19/0092* (2013.01); *G06T 2207/10048* (2013.01); *G06T 2207/20032* (2013.01); *G06T 2207/20036* (2013.01); *G06T 2207/30136* (2013.01)

(56) References Cited

U.S. PATENT DOCUMENTS

| | | | | |
|---|---|---|---|---|
| 4,021,840 | A * | 5/1977 | Ellsworth | B23K 9/1274 219/124.1 |
| 4,183,055 | A * | 1/1980 | Burkhardt, Jr. | B23K 15/02 348/164 |
| 4,532,408 | A * | 7/1985 | Richardson | B23K 9/0956 219/124.34 |
| 4,599,506 | A * | 7/1986 | Burke | B23K 9/095 219/124.34 |
| 5,292,195 | A * | 3/1994 | Crisman, Jr. | G01N 25/72 250/330 |
| 6,046,431 | A * | 4/2000 | Beattie | B23K 9/1274 219/124.34 |
| 8,144,193 | B2 * | 3/2012 | Melikian | B23K 9/32 348/90 |
| 2007/0075048 | A1* | 4/2007 | Kunisaki | B23K 11/253 219/91.1 |
| 2010/0163732 | A1* | 7/2010 | Louban | G01N 25/72 250/341.6 |
| 2010/0201803 | A1* | 8/2010 | Melikian | B23K 9/32 348/90 |
| 2012/0328203 | A1* | 12/2012 | Medasani | G06T 7/33 382/225 |

FOREIGN PATENT DOCUMENTS

| | | |
|---|---|---|
| CN | 103464869 | 12/2013 |
| CN | 103464869 A * | 12/2013 |
| CN | 104551347 | 4/2015 |
| JP | 09295146 A * | 11/1997 |
| JP | H09295146 | 11/1997 |
| JP | 2002361424 | 12/2002 |
| JP | 2002361424 A * | 12/2002 |

* cited by examiner

| | When an arc shakes to the left side wall of a groove | When an arc shakes to the right side wall of a groove |
|---|---|---|
| Original infrared image before image processing and image capture window position | (a) | (b) |
| Arc morphological image after global threshold segmentation and morphological erosion | (c) | (d) |
| Welding wire region image captured in a small window | (e) | (f) |
| Welding wire contour image after local threshold segmentation | (g) | (h) |
| Welding wire contour image after image erosion | (j) | (k) |
| Welding wire contour image after edge extraction | (m) | (n) |
| Welding wire axis position image | (u) | (v) |

FIG.11

INFRARED VISION SENSING DETECTION METHOD AND DEVICE FOR NARROW-GAP WELD SEAM DEVIATION

CROSS-REFERENCE TO RELATED APPLICATION

This application is a 371 application of the International PCT application serial no. PCT/CN2015/097552, filed on Dec. 16, 2015, which claims the priority benefit of China application no. 201410833371.8, filed on Dec. 30, 2014. The entirety of each of the above-mentioned patent applications is hereby incorporated by reference herein and made a part of this specification.

FIELD OF THE INVENTION

The present invention relates to the field of welding technology, and in particular, to an infrared vision sensing method and device for detecting in real-time a shaking (or swing) or rotating arc narrow-gap weld seam deviation.

DESCRIPTION OF RELATED ART

An actual narrow-gap gas metal arc welding (GMAW) process is often affected by factors such as a groove machining error, a workpiece assembly error, and a welding thermal deformation, causing changes in the groove gap size and the center position of the weld seam, and therefore, the center of a welding torch is deviated from the center of the weld seam (that is, weld seam deviation occurs). If the weld seam is not tracked or controlled, the weld seam deviation may accumulate. In this case, even if a groove side wall penetration control technology based on the arc swing or rotation process is applied, the quality of narrow-gap welding is still affected. The sensing technology is the key to implementation of weld seam tracking, and weld seam tracking sensing methods are mainly classified into three types: contact type, non-contact type, and arc sensing type (i.e., semi-contact type). As a representative of the non-contact type sensing method, a vision sensor receives special attention due to its advantages such as a large information volume, high sensitivity, being applicable to various groove forms, and strong resistance against electromagnetic interference.

In the patent document with the Chinese Patent No. ZL201210325926.9 and entitled "Infrared Vision Sensing-Based Narrow-Gap Welding Monitoring and Weld Seam Deviation Detection Method", for a shaking arc narrow-gap MAG welding application, an infrared camera obtains information about left and right groove reference boundaries in advance during centering of a welding torch; during welding, after the infrared camera obtains in real time an image of a narrow-gap groove edge away from the arc side, single-side edge position information of the groove is extracted through image processing, and is compared with the reference groove boundary at the same side obtained in advance, to calculate weld seam deviation. The disadvantage of this method lies in that: the single-side groove edge position detection for weld seam deviation is only applicable to cases where the groove gap is constant, and is inapplicable to common situations where the groove gap is varying. Therefore, the application range is small.

In the patent with the Chinese Patent Application No. 201310375369.6 and entitled "Vision Sensing-Based Weld Seam Deviation Identification Method and Device for Rotating Arc Narrow-Gap MAG Welding", for a rotating arc narrow-gap MAG welding application, a charge coupled device (CCD) infrared camera obtains, by means of sampling triggering, welding images when the arc rotates to positions on the left and right side walls of a groove, and weld seam deviation is calculated according to arc center and groove center position information obtained through image processing. The disadvantages of the method lie in that: 1. During actual narrow-gap welding, the arc is generally asymmetric about the axis thereof, especially, when the arc is close to the edge on one side of the groove, the arc usually climbs along the side wall of the groove; therefore, when the geometric center of the arc is extracted according to the weld seam deviation identification method, it is difficult to accurately reflect the actual rotating center of the arc, thus affecting the precision of weld seam deviation detection, and also affecting the engineering practicability. 2. The arc center detection method for the weld seam deviation is only suitable for high-frequency rotating arc narrow-gap welding applications, and is not suitable for low-frequency swing (including shaking) arc narrow-gap welding application scenarios. 3. The used CCD camera has a small dynamic range and a low response speed, affecting the precision and real-time performance of the weld seam deviation detection.

SUMMARY OF THE INVENTION

To solve the disadvantages such as low precision, a small application range, and poor engineering practicability of sensing detection for weld seam deviation in the prior art, the present invention provides an infrared vision sensing detection method and device for narrow-gap weld seam deviation, which are applicable to a shaking or swing arc or a rotating arc. Weld seam deviation information is obtained by detecting position changes of a welding wire relative to left and right side walls of a groove when the arc moves to two side walls of the groove, so that advantages such as high detection precision, strong environment adaptability, and good practicability are achieved.

The infrared vision sensing detection device for narrow-gap weld seam deviation provided in the present invention includes a narrow-gap welding torch, an arc current sensor, a computer image processing system, and an infrared photographing system. One end of a bent conducting rod in the narrow-gap welding torch is connected to a motor driving and feeding mechanism, and the other end is connected to a straight-type contact tube. A welding wire passing through the narrow-gap welding torch extends into a groove to be welded to generate a welding arc. The infrared photographing system includes a digital infrared camera and an infrared filtering system. The computer image processing system includes an image acquisition card, a welding wire position information extraction module, and a weld seam deviation value calculation module that are connected in sequence. The image acquisition card is connected to the infrared camera through a video line. Signals $P_L$ and $P_R$ when the arc generated by the motor driving and feeding mechanism moves to positions closest to the left and right side walls of the groove are simultaneously input to the infrared camera and the image acquisition card. One end of a welding power source is connected to the motor driving and feeding mechanism, and a connection cable on the other end passes through a detection ring of the current sensor or is connected in series with the current sensor, and then is connected to a workpiece. A pulsed welding arc base value current signal $i_b$ and the arc position signal $P_L$ (or $P_R$) detected by the arc current sensor jointly act on an image photographing trigger signal input end of the infrared camera.

The technical solution of the infrared vision sensing detection method for narrow-gap weld seam deviation according to the present invention includes the following steps:

1) the whole narrow-gap welding torch and the infrared photographing system move together towards the front of the groove at a welding speed $V_w$, and the infrared camera is triggered according to the arc position signal $P_L$ or $P_R$, to acquire a welding region image at this time point, and the image is sent to the computer image processing system through the image acquisition card;

2) when the arc moves to the position closest to the left and right side walls of the groove, the welding wire position information extraction module receives welding image information from the image acquisition card, processes the image to extract a current distance $X_{1i}$ from a right position detection point of the welding wire to a groove left edge and a current distance $X_{2i}$ from a left position detection point of the welding wire to a groove right edge, and sends the current distances to the weld seam deviation value calculation module;

3) the weld seam deviation value calculation module calculates a current detection value $\Delta X_i$ of the weld seam deviation according to the formula $\Delta X_i = (X_{1i} - X_{2i})/2$, and uses a median or a mean of latest n (n≥1) weld seam deviation detection values as a current sampling value $\Delta X_{si}$ of the weld seam deviation; if $\Delta X_{si}=0$, the weld seam is not deviated, if $\Delta X_{si}>0$, the welding wire is deviated towards the right side of the groove, and if $\Delta X_{si}<0$, the welding wire is deviated towards the left side of the groove.

In step 2), when the arc moves to the position closest (signal $P_R$ is valid) to the right side wall of the groove, the welding wire position information extraction module adjusts an abscissa value of a positioning point $B_{1i}$ of a groove left image capture window according to a horizontal position change of a groove left edge line, to capture a groove left image without interference from the arc; after the groove left edge is extracted, a current distance $L_{2i}$ from the groove left edge to the left boundary of the global image is calculated; after a welding wire right position image is captured in a welding wire right image capture window, a current distance $L_{1i}$ from the center of the welding wire to the left boundary of the global image is extracted, to calculate a current distance from the right position detection point of the welding wire to the groove left edge: $X_{1i}=(L_{1i}-L_{2i})$. When the arc moves to the position closest (signal $P_L$ is valid) to the left side wall of the groove, the welding wire position information extraction module adjusts an abscissa value of a positioning point $B_{2i}$ of a groove right image capture window according to a horizontal position change of a groove right edge line, to capture a groove right image without interference from the arc; after the groove right edge is extracted, a current distance $L_{3i}$ from the groove right edge to the left boundary of the global image is calculated; after a welding wire left position image is captured in a welding wire left image capture window, a current distance $L_{4i}$ from the center of the welding wire to the left boundary of the global image is extracted, to calculate a current distance from the left position detection point of the welding wire to the groove right edge: $X_{2i}=(L_{3i}-L_{4i})$. When the arc moves to the position closest to the right side wall of the groove again, a next distance $L_{1(i+1)}$ from the groove left edge to the left boundary of the global image and a next distance $L_{1(i+1)}$ from the right position detection point of the welding wire to the left boundary of the global image are extracted first, and then a next distance from the right position detection point of the welding wire to the groove left edge is calculated: $X_{1(i+1)}=(L_{1(i+1)}-L_{2(i+1)})$, thereby calculating a next detection value of the weld seam deviation: $\Delta X_{(i+1)}=(X_{1(i+1)}-X_{2i})/2$, and so forth, so that the weld seam deviation is detected twice in one arc movement cycle.

Ordinate values of the $L_{2i}$ and $L_{2(i+1)}$ detection points on the groove left edge line are the same as an ordinate value of the $L_{3i}$ detection point on the groove right edge line; ordinate values of the $L_{1i}$ and $L_{1(i+1)}$ detection points on the right-position welding wire axis are the same as an ordinate value of the $L_{4i}$ detection point on the left-position welding wire axis; a final detection value of the distance $L_{1i}$, $L_{4i}$ or $L_{1(i+1)}$ from the welding wire position detection point to the left boundary of the global image is a median or a mean of detection values at m (m≥1) different positions that are in the welding wire image left and right capture windows and on the welding wire axis; a final detection value of the distance $L_{2i}$, $L_{3i}$ or $L_{2(i+1)}$ from the groove left and right edges to the left boundary of the global image is a median or a mean of detection values at k (k≥1) different positions that are in the groove left and right image capture windows and on the groove left and right edge lines.

When the image is processed, coordinate values of the highest point in the arc region are first extracted by means of global welding image processing, and coordinate values of positioning points of the welding wire left and right image capture windows are adjusted according to a change in the coordinate position of the highest point of the arc region; then, small-window groove images captured by the groove left and right image capture windows and small-window welding wire images captured by the welding wire left and right image capture windows are separately processed; during processing of the small-window images captured by the welding wire left and right image capture windows, local adaptive threshold segmentation processing is performed first, and after the contour of the welding wire is extracted by means of morphological erosion on the full-window image, the framework of the welding wire is extracted by using a Canny edge detection algorithm; and finally, the axis position of the welding wire is calculated.

In the case of pulsed welding using a shaking (or rotating) arc, when the arc moves to the position closest to the left side wall or right side wall of the groove (the arc position signal $P_L$ or $P_R$ is valid), once the current sensor detects that the first pulsed welding arc base value current signal $i_b$ of the pulsed arc arrives, the infrared camera is triggered immediately, to acquire a welding region image with smallest interference from arc light at this time point, achieving welding image acquisition synchronized with a base value current period of the pulsed arc.

Compared with the prior art, the present invention has the following beneficial effects:

(1) Compared with the existing arc center detection method, the present invention extracts weld seam deviation according to information about a position of a welding wire relative to the left and right side walls of a groove, which can effectively avoid impact of the asymmetric arc form on detection precision.

(2) Compared with the existing groove single-side edge position detection method, the present invention reflects dynamic welding wire and groove edge position information without the need to establish a reference template in advance, and is applicable to cases where the groove gap changes dynamically.

(3) During processing on the acquired welding image, the present invention adjusts in real time the positions of the welding wire image and the groove edge image capture windows according to changes in the arc and groove edge positions, thus improving the environmental adaptability thereof.

(4) The relative position of the welding wire in the welding groove is detected according to two adjacent welding images, so that the weld seam deviation can be detected twice in one arc movement cycle, thereby improving the real-time performance of the weld seam deviation detection.

(5) In cases where pulsed welding is performed using a shaking (or swing or rotating) arc, the detection method synchronized with the pulsed arc base value current used in the present invention can acquire a welding image with smallest interference from arc light, further improving the precision of the weld seam deviation detection.

(6) The present invention is not only applicable to a shaking (or swing) arc narrow-gap welding scenario with a relatively low arc movement frequency, but is also applicable to rotating arc narrow-gap welding with a relatively high arc movement frequency, achieving a wide application range.

BRIEF DESCRIPTION OF THE DRAWINGS

The present invention is further described in detail below with reference to the accompanying drawings and specific embodiments, but the protection scope of the present invention is not limited to the following embodiments. All technical solutions obtained using equivalent substitutions or equivalent alterations fall within the protection scope of the present invention.

FIG. 11 is an instance diagram of a welding wire axis position information extraction effect during direct current welding;

In FIG. 1: arc; 2: straight-type contact tube; 3: bent conducting rod; 4: motor driving and feeding mechanism; 5: welding wire; 6: wire feeder; 7: workpiece; 8: double-semi-circumferential arc shaking trajectory (or circumferential arc rotation trajectory); 9: groove to be welded; 10: circular arc shaking trajectory; 11: infrared camera; 12: infrared filtering system; 13: arc current sensor; 14: welding power source; 15: computer image processing system; 15-1: image acquisition card; 15-2: welding wire position information extraction module; 15-3: weld seam deviation value calculation module. $i_b$: pulse base value current; $V_w$: welding speed, $P_L$: signal when the arc (in a direction perpendicular to the welding speed $V_w$) moves to a position closest to the left side wall of the groove; $P_R$: a signal when the arc (in a direction perpendicular to the welding speed $V_w$) moves to a position closest to the right side wall of the groove.

In FIG. 2 to FIG. 7: $A_{1i}O_{2i}A_{2i}$: circular shaking trajectory 10 of the arc relative to the welding torch; $O_{1i}$: midpoint of the chord length of circular arc shaking trajectory $A_{1i}O_{2i}A_{2i}$; $O_{2i}$: midpoint of the arc shaking trajectory; $O_{3i}$: projection point of the center of the welding torch on the bottom of the groove, and also the center point of a circumferential shaking trajectory 8 of the arc relative to the welding torch; $O_4O_5$: groove center line; α: arc shaking angle; $A_{1i}$: closest position point from the arc to the left side wall L of the groove (in a direction perpendicular to the welding speed $V_w$); $A_{2i}$: closest position point from the arc to the right side wall R of the groove (in a direction perpendicular to the welding speed $V_w$); $A_{1i}F_i$: closest distance from the arc to the left side wall L; $A_{2i}E_i$: closest distance from the arc to the right side wall R; $E_iF_i$: direction perpendicular to the welding speed $V_w$; $O_{3i}A_{1i}=O_{3i}A_{2i}=O_{3i}O_{2i}=r$, which is an arc shaking radius or rotation radius.

In FIG. 8 to FIG. 9: 17: groove left image capture window; 18: welding wire right image capture window; 19: welding wire left image capture window; 20: groove right image capture window; 21: groove left edge; 22: groove right edge; 23: welding wire right position detection line; 24: welding wire left position detection line. $C_1$: highest point of an arc region when the arc is closest to the groove right side wall 22; $C_2$: highest point of the arc region when the arc is closest to the groove left side wall 21; $D_{1i}$: current positioning point of the welding wire right image capture window 18, $D_{2i}$: current positioning point of the welding wire left image capture window 19; $B_{1i}$: current positioning point of the groove left image capture window 17; $B_{2i}$: current positioning point of the groove right image capture window 20; $L_{1i}$: current distance from the right position center of the welding wire to the left boundary of the global image; $L_{2i}$: current distance from the groove left edge 21 to the left boundary of the global image; $L_{3i}$: current distance from the groove right edge 22 to the left boundary of the global image; $L_{4i}$: current distance from the left position center of the welding wire to the left boundary of the global image; $X_{1i}$: current distance from the right position detection point of the welding wire to the groove left edge 21; $X_{2i}$: current distance from the left position detection point of the welding wire to the groove right edge 22; ΔXi: current detection value of the weld seam deviation.

DETAILED DESCRIPTION OF THE EMBODIMENTS

Figure 1:
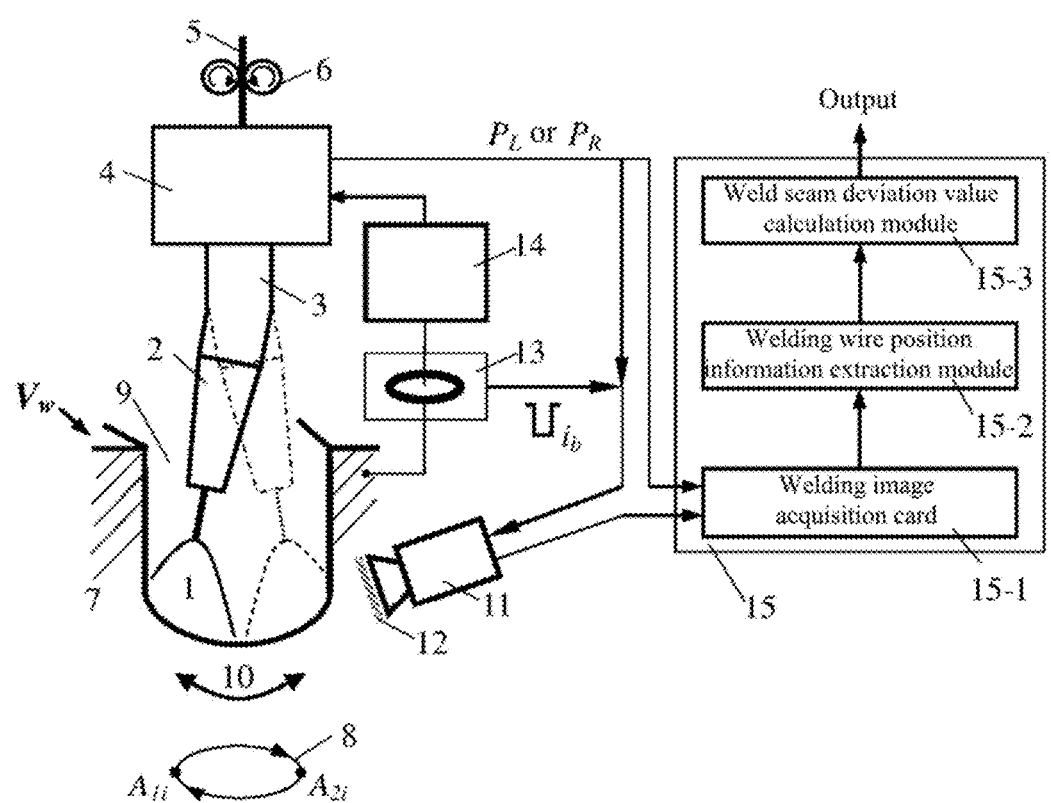
FIG. 1 is a principle block diagram of an infrared vision sensing detection device for narrow-gap weld seam deviation.

An infrared vision sensing detection device for narrow-gap weld seam deviation according to the present invention, as shown in FIG. 1, mainly includes a narrow-gap welding torch, an arc current sensor 13, a computer image processing system 15, an infrared photographing system, and the like. The narrow-gap welding torch further includes a motor driving and feeding mechanism 4, a bent conducting rod 3, a straight-type contact tube 2, a nozzle mechanism, and the like, where one end of the bent conducting rod 3 is connected to the motor driving and feeding mechanism 4, and the other end is connected to the straight-type contact tube 2. The motor driving and feeding mechanism 4 in the narrow-gap welding torch may be directly driven by a hollow shaft motor, or may be indirectly driven by a common motor through a transmission gear, and preferably is directly driven by a hollow shaft motor. A photoelectric detection (or electromagnetic) detection device is installed in the motor driving and feeding mechanism 4, so as to detect a signal $P_L$ or $P_R$ when the arc 1 (in a direction perpendicular to a welding speed $V_w$) moves to a position closest to the left side wall or right side wall of the groove 9. By means of the welding power source 14, the narrow-gap welding torch and a drive control system thereof, welding energy parameters (arc current, arc voltage, and welding speed $V_w$) and arc shaking parameters or arc rotation parameters can be set before welding.

A welding wire 5 sent out by a wire feeder 6 sequentially passes through the motor driving and feeding mechanism 4, the bent conducting rod 3, and the central hole of the straight-type contact tube 2, and then extends into a groove to be welded 9 to generate a welding arc 1; one end of the welding power source 14 is connected to the motor driving and feeding mechanism 4, and is connected to a brush feeding mechanism in the motor driving and feeding mechanism 4, and the other end of the welding power source 14 is connected to a workpiece 7, thereby implementing welding feed without winding of a welding cable. A gas supply system provides, through the nozzle mechanism in the welding torch, active or inert shielding gas for a welding region where the arc 1 is located. However, it is unnecessary to use a nozzle mechanism or provide shielding gas to the welding region when welding is performed by using a self-shielded flux-cored welding wire. Movement manners of the arc 1 with respective to the welding torch can be classified into two major types: a shaking (or swing) type and a rotating type, and specifically include: reciprocating shaking along a circular trajectory 10, shaking along a single-direction double-semi-circumferential trajectory 8 (the arc stops at positions $A_{1i}$ and $A_{2i}$ closest to the left and right side walls of the groove), and rotating along a circumferential trajectory (the arc does not stop at positions $A_{1i}$ and $A_{2i}$ closest to the left and right side walls of the groove). In addition to arc rotation by means of the bent conducting rod as shown in FIG. 1, the movement manners of the rotating arc further include: eccentric arc rotation by means of the contact tube, arc rotation by means of the whole conducting rod revolving around the center of the welding torch, and other common movement manners.

The infrared photographing system includes an infrared camera 11 and an infrared filtering system 12. The infrared filtering system 12 is coaxially connected to the infrared camera 11 and is mounted right in front of the infrared camera 11. The infrared camera 11 may be of a charge coupled device (CCD) or a complementary metal oxide semiconductor (CMOS) type, and is preferably of the CMOS type. The infrared camera 11 is fixed right in front of or behind the welding torch, so that an angle of 20 to 60° is formed between the infrared camera 11 and the bottom surface of the groove to be welded 9, and in this way, the infrared camera 11 can easily capture a welding region image of the groove to be welded 9. A digital infrared camera 11 having a zoom range of 18 to 45 mm and an aperture of 5.6 to 32 is selected, to acquire the welding region image in an external triggering manner. The infrared filtering system 12 includes a narrow bandpass filter, a neutral dimmer, and goggles, where a central wavelength of the narrow bandpass filter is 700 to 1100 nm, and the transmittance of the neutral dimmer is 1 to 50%. The goggles are used for providing protection against welding spattering, the narrow bandpass filter is used for filtering out interference from optical radiation such as arc light, smoke, and spattering, and the neutral dimmer may be used for adjusting the light intensity of radiation from the arc and weld pool, so that a clear welding infrared image can be acquired.

The computer image processing system 15 mainly includes an image acquisition card 15-1, a welding wire position information extraction module 15-2, and a weld seam deviation value calculation module 15-3 that are sequentially connected, and is further equipped with hardware devices such as a display and a memory that are necessary for an ordinary computer. The image acquisition card 15-1 is disposed in a card slot of the whole computer image processing system 15 and is connected to the infrared camera 11 through a video line. A photoelectric (or electromagnetic) detection device installed in the motor driving and feeding mechanism 4 is separately connected to the image acquisition card 15-1 and the infrared camera 11 through cables, and simultaneously output, to the image acquisition card 15-1 and the infrared camera 11, a signal $P_L$ or $P_R$ when the arc 1 moves (in a direction perpendicular to the welding speed $V_w$) to a position closest to the left side wall or the right side wall of the groove 9.

The infrared camera 11 captures a welding region image in an external triggering manner according to the arc position signal $P_L$ or $P_R$, and sends the welding image signal to the computer image processing system 15 through the image acquisition card 15-1. After image processing (for details of a specific image processing method, refer to the following description), a weld seam deviation value is extracted according to information about the position of the welding wire relative to the left and right side walls of the groove, and is output for use in monitoring and display as well as subsequent welding torch position adjustment. Compared with the existing arc center detection method, the present invention can effectively avoid the influence from the asymmetric arc form on the detection precision of the weld seam deviation. In addition, if the shaking and rotating arc welding torch in FIG. 1 is replaced with a swing arc or rotating arc welding torch of another form, the sensing detection method and device for weld seam deviation are also applicable.

When pulsed welding is performed using a shaking (or rotating) arc, a connection cable at one end of the welding power source 14 is connected to a workpiece 7 after passing through a detection ring of a Hall current sensor 13 or being connected in series with a shunt-type current sensor 13, and an arc current is detected by using the current sensor 13 in a non-contact manner or a contact manner. The pulse base value current signal $i_b$ output by the current sensor 13 and the arc position signal $P_L$ or $P_R$ jointly act on a trigger signal input end of the infrared camera 11, so that in a valid period of the arc position signal $P_L$ or $P_R$, once the current sensor 13 detects that the first base value period current signal of the pulsed arc 1 arrives, the infrared camera 11 is triggered immediately, to acquire a welding region image with smallest interference from the arc light, thus implementing welding image acquisition synchronized with the pulsed arc base value current $i_b$, so as to improve the detection efficiency of the weld seam deviation during pulsed arc welding.

Figure 2:
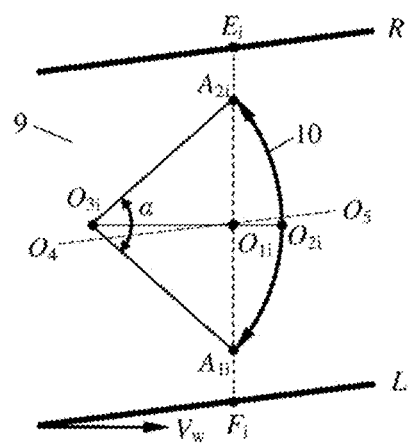
FIG. 2 is a schematic diagram in the case where a weld seam is not deviated (that is, a welding torch is centered) when welding is performed using a circular shaking arc in FIG. 1.
Figure 3:
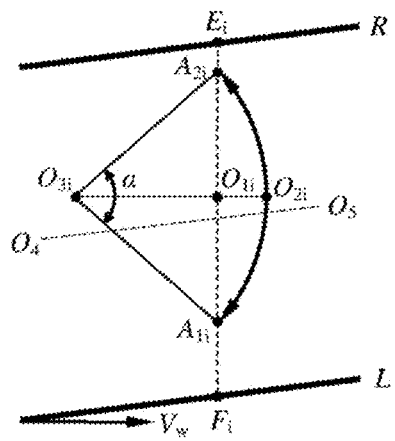
FIG. 3 is a schematic diagram in the case where a weld seam is deviated leftwards (that is, a welding torch is deviated rightwards) when welding is performed using a circular shaking arc in FIG. 1.
Figure 4:
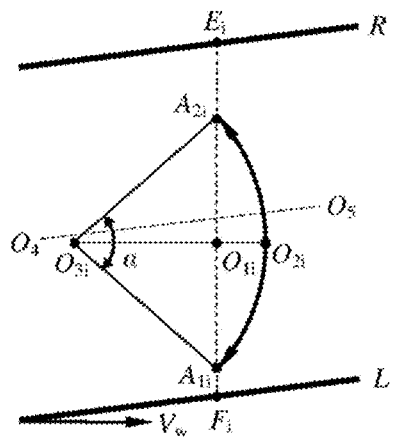
FIG. 4 is a schematic diagram in the case where a weld seam is deviated rightwards (that is, a welding torch is deviated leftwards) when welding is performed using a circular shaking arc in FIG. 1.

When narrow-gap welding is performed by using a reciprocating circular shaking arc, the arc shaking parameters include a shaking frequency, shaking amplitude (that is, a shaking angle), a shaking radius, a dwell time of the arc 1 at positions $A_{1i}$ and $A_{2i}$ closest to the left and right side walls of the groove 9, and the like. As shown in FIG. 2, FIG. 3, and FIG. 4, at the time point i, the arc 1 shakes around the welding torch center $O_{3i}$ along a circular trajectory that is symmetric about the shaking trajectory midpoint $O_{2i}$, where a shaking radius is r ($r=O_{3i}A_{1i}=O_{3i}A_{2i}$) and a shaking angle is α; the arc 1 usually stops for a period of time (which is tens to hundreds of milliseconds) at the positions $A_{1i}$ and $A_{2i}$ closest to the left and right side walls of the groove 9, and the shaking frequency is generally within several hertz. When $A_{1i}F_i=A_{2i}E_i$, as shown in FIG. 2, the chord length midpoint $O_{1i}$ of the circular shaking trajectory $A_{1i}O_{2i}A_{2i}$ of the arc 1 is on the groove center line $O_4O_5$, and in this case, the weld seam is not deviated (that is, the welding torch is aligned with the center). When $A_{1i}F_i>A_{2i}E$, as shown in FIG. 3, the chord length midpoint $O_{1i}$ of the circular shaking trajectory $A_{1i}O_{2i}A_{2i}$ of the arc 1 is deviated towards the groove right side R, and in this case, the weld seam is deviated leftwards (or the welding torch is deviated rightwards). When $A_{1i}F_i<A_{2i}E_i$, as shown in FIG. 4, the chord length midpoint $O_{1i}$ of the circular shaking trajectory $A_{1i}O_{2i}A_{2i}$ of the arc 1 is deviated towards the groove left side L, and in this case, the weld seam is deviated rightwards (or the welding torch is deviated leftwards).

Figure 5:
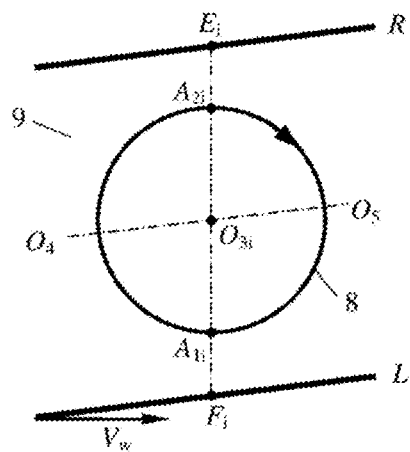
FIG. 5 is a schematic diagram in the case where a weld seam is not deviated (that is, a welding torch is centered) when welding is performed using a rotating arc and a double-semi-circumferential shaking arc in FIG. 1.
Figure 6:
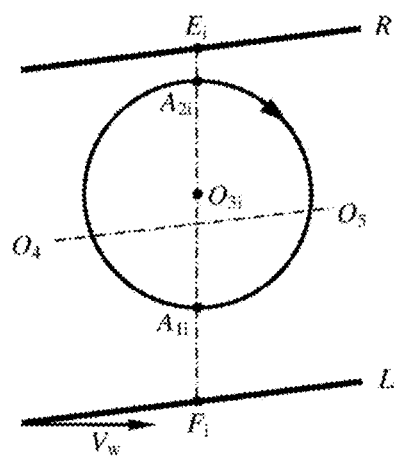
FIG. 6 is a schematic diagram in the case where a weld seam is deviated leftwards (that is, a welding torch is deviated rightwards) when welding is performed using a rotating arc and a double-semi-circumferential shaking arc in FIG. 1.
Figure 7:
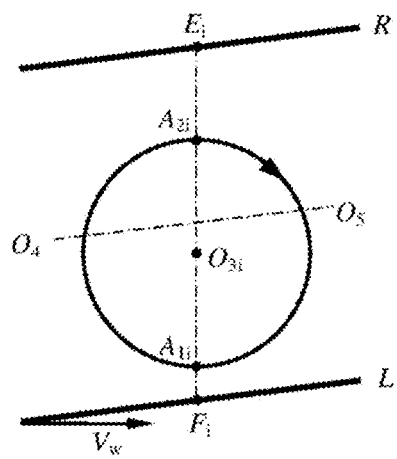
FIG. 7 is a schematic diagram in the case where a weld seam is deviated rightwards (that is, a welding torch is deviated leftwards) when welding is performed using a rotating arc and a double-semi-circumferential shaking arc in FIG. 1.

When narrow-gap welding is performed using a rotating arc or a single-direction double-semi-circumferential shaking arc, as shown in FIG. 5, FIG. 6, and FIG. 7, at the time point i, the arc 1 moves around the welding torch center $O_{3i}$ along a single-direction circumferential trajectory or shakes around the welding torch center $O_{3i}$ along a single-direction double-semi-circumferential trajectory, where the rotating radius or the shaking radius is r ($r=O_{3i}A_{1i}=O_{3i}A_{2i}$), and the arc rotating frequency is generally about several hertz to 100 Hz. During shaking along a single-direction double-semi-circumferential trajectory, similar to the case of welding using the shaking arc that reciprocates along a circular trajectory as shown in FIG. 2 to FIG. 4, generally, the arc also needs to stop for a period of time at positions $A_{1i}$ and $A_{2i}$ closest to the left and right side walls of the groove. When $A_{1i}F_i=A_{2i}E_i$, as shown in FIG. 5, the center $O_{3i}$ of the movement trajectory of the arc 1 is on the groove center line $O_4O_5$, and in this case, the weld seam is not deviated (that is, the welding torch is aligned with the center). When $A_{1i}F_i>A_{2i}E_i$, as shown in FIG. 6, the center $O_{3i}$ of the movement trajectory of the arc 1 is deviated towards the groove right side R, and in this case, the weld seam is deviated leftwards (or the welding torch is deviated rightwards). When $A_{1i}F_i<A_{2i}E_i$, as shown in FIG. 7, the center $O_{3i}$ of the movement trajectory of the arc 1 is deviated towards the groove left side L, and in this case, the weld seam is deviated rightwards (or the welding torch is deviated leftwards).

Referring to FIG. 1 to FIG. 9, specific implementation steps of the infrared vision sensing detection method for narrow-gap weld seam deviation according to the present invention are described below by using a shaking or rotating arc narrow-gap welding application as an example (a narrow-gap weld seam deviation detection method in which an arc moves in another manner is similar to this method):

1. A welding region image is acquired. After the welding arc is ignited, a narrow-gap welding torch drive mechanism (not shown in the figure) drives the whole narrow-gap welding torch and the infrared photographing system to move together towards the front of the groove 9 at a welding speed $V_w$; meanwhile, according to a signal $P_L$ (or $P_R$) when the arc 1 generated by the motor driving and feeding mechanism 4 moves to the left side wall (or right side wall) of the groove 9, the infrared camera 11 is triggered to acquire a welding region image of this time point, and the welding region image is sent to the computer image processing system 15 through the image acquisition card 15-1.

Figure 8:
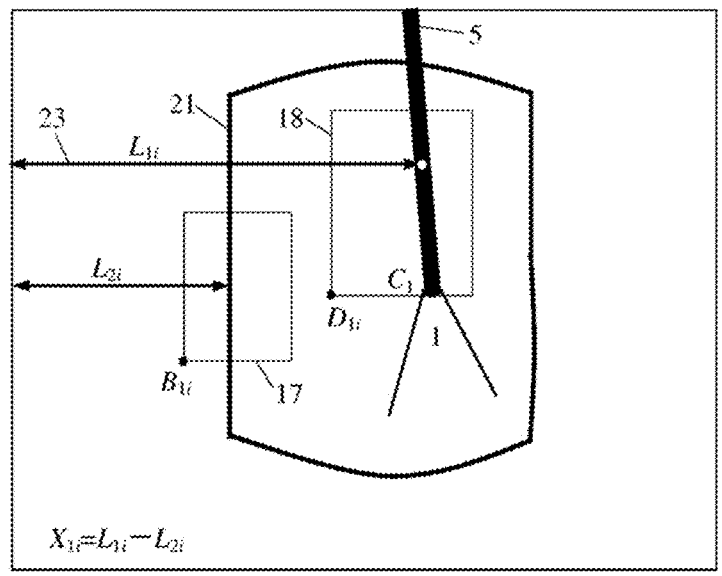
FIG. 8 is a principle diagram of weld seam deviation detection when the arc is deviated toward the right side wall of the groove in FIG. 1.

2. Position information when the welding wire is at the right side of the groove is extracted. Referring to FIG. 8, when the arc 1 moves to the position closest to the right side wall of the groove 9 (the signal $P_R$ is valid), the welding wire position information extraction module 15-2 receives the welding image information from the image acquisition card 15-1, and then processes the image. During image processing, an abscissa value of the positioning point $B_{1i}$ of the groove left image capture window 17 is adjusted according to a horizontal position change of the groove left edge line 21, to capture a groove left image without interference from the arc; after the groove left edge 21 is extracted, a current distance $L_{2i}$ from the groove left edge 21 to the left boundary of the global image is calculated; the welding wire right image capture window 18 captures the welding wire right position image, and then extracts, on the detection line 23, a current distance $L_{1i}$ from the center of the welding wire 5 to the left boundary of the global image; then, a current distance $X_{1i}=(L_{1i}-L_{2i})$ from the right position detection point of the welding wire to the groove left edge 21 is calculated, and the value $X_{1i}$ is sent to the weld seam deviation value calculation module 15-3.

Figure 9:
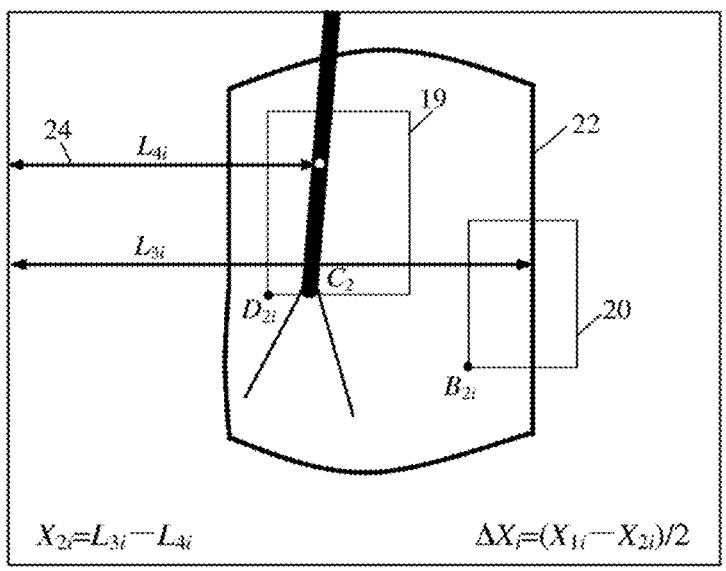
FIG. 9 is a principle diagram of weld seam deviation detection when the arc is deviated toward the left side wall of the groove in FIG. 1.

3. Position information when the welding wire is at the left side of the groove is extracted. Referring to FIG. 9, when the arc 1 moves to the position closest to the left side wall of the groove 9 (the signal $P_L$ is valid), the welding wire position information extraction module 15-2 receives the welding image information from the image acquisition card 15-1, and then processes the image. During image processing, an abscissa value of the positioning point $B_{2i}$ of the groove right image capture window 20 is adjusted according to a horizontal position change of the groove right edge line 22, to capture a groove right image without interference from the arc; after the groove right edge 22 is extracted, a current distance $L_{3i}$ from the groove right edge 22 to the left boundary of the global image is calculated; the welding wire left image capture window 19 captures the welding wire left position image, and then extracts, on the detection line 24, a current distance $L_{4i}$ from the center of the welding wire 5 to the left boundary of the global image; then, a current distance $X_{2i}=(L_{3i}-L_{4i})$ from the left position detection point of the welding wire to the groove right edge 22 is calculated, and the value $X_{2i}$ is sent to the weld seam deviation value calculation module 15-3.

4. Information of the weld seam deviation is calculated. After receiving the welding wire position information $X_{1i}$ and $X_{2i}$ extracted by the welding wire position information extraction module 15-2 successively, the weld seam deviation value calculation module 15-3 calculates a current detection value $\Delta X_i$ of the weld seam deviation according to the formula $\Delta X_i=(X_{1i}-X_{2i})/2$, and then uses a median or a mean of the latest n (n≥1) detection values of the weld seam deviation (that is, $\Delta X_{i-(n-i)}, X_{i-(n-2)}, \ldots, \Delta X_{i-1}, \Delta X_i$) as a current sampling value $\Delta X_{si}$ of the weld seam deviation, and outputs the sampling value $\Delta X_{si}$ to a welding torch position adjustment system in the narrow-gap welding torch drive mechanism, to adjust the position of the welding torch. If $\Delta X_{si}=0$, the weld seam is not deviated (corresponding to the cases shown in FIG. 2 and FIG. 5), if $\Delta X_{si}>0$, the welding wire 5 is deviated towards the right side of the groove (indicating that the weld seam is deviated leftwards relative to the welding torch, corresponding to the cases shown in FIG. 3 and FIG. 6), and if $\Delta X_{si}<0$, the welding wire 5 is deviated towards the left side of the groove (indicating that the weld seam is deviated rightwards relative to the welding torch, corresponding to the cases shown in FIG. 4 and FIG. 7); step 1 to step 4 are repeated, till the welding process is finished.

In the sensing detection method for weld seam deviation, step 2 and step 3 may be performed in a reverse order, and in step 2 and step 3, the current distance $L_{1i}$ or $L_{4i}$ from the center of the welding wire 5 to the left boundary of the global image may be extracted first, and then the current distance $L_{2i}$ or $L_{3i}$ from the groove edge 21 or 22 to the left boundary of the global image is calculated. Moreover, when the arc 1 moves to the position closest to the right side wall of the groove again, according to a method similar to that in step 2, the welding wire position information extraction module 15-2 extracts a next distance $L_{2(i+1)}$ from the groove left edge 21 to the left boundary of the global image, and a next distance $L_{1(i+1)}$ from the right position detection point of the welding wire to the left boundary of the global image, and then calculates a next distance from the right position detection point of the welding wire to the groove left edge 21: $X_{1(i-1)}=(L_{1(i+1)}-L_{2(i+1)})$, and sends the value $X_{1(i+1)}$ to the weld seam deviation value calculation module 15-3; then, the weld seam deviation value calculation module 15-3 calculates a next detection value $\Delta X_{(i+1)}$ of the weld seam deviation according to the formula $\Delta X_{1(i+1)}=(X_{1(i+1)}-X_{2i})/2$, and so forth, so that the weld seam deviation is detected twice in one arc movement (shaking or rotating) cycle.

In step 2 and step 3 of the sensing detection method for weld seam deviation, the groove left image capture window 17 or the groove right image capture window 20 may be disposed on a groove side away from the arc 1, or may be disposed on a groove side close to the arc 1, and is preferably disposed on the groove side away from the arc 1, as shown in FIG. 8 and FIG. 9. During positioning of the welding wire right image capture window 18 or the welding wire left image capture window 19, after median filtering, contrast stretching, global fixed threshold segmentation, and arc contour morphological erosion are sequentially performed on the global (overall) welding image, position coordinates $(X_{C1i}, Y_{C1i})$ or $(X_{C2i}, Y_{C2i})$ of the highest point $C_1$ or $C_2$ of the arc region are extracted, and it is determined that the ordinate value of a positioning point $D_{1i}$ or $D_{2i}$ of the welding wire image capture window 18 or 19 is $(Y_{C1i}+\Delta Y)$ or $(Y_{C2i}+\Delta Y)$ according to the ordinate value of the highest point $C_1$ or $C_2$ of the arc region, where $\Delta Y$ is an additional adjustment quantity. Meanwhile, the abscissa value of the positioning point $D_{1i}$ or $D_{2i}$ of the welding wire image capture window 18 or 19 is adjusted (for a specific algorithm, refer to the following description).

The ordinate of the welding wire position detection line 23 or 24 is located in the welding wire image capture window 18 or 19, and is at or above a position with half height of the welding wire image capture window 18 or 19. Moreover, the ordinate values of the $L_{2i}$ and $L_{2(i+1)}$ detection points on the groove left edge line 21 are the same as the ordinate value of the $L_{3i}$ detection point on the groove right edge line 22; the ordinate values of the $L_{1i}$ and $L_{1(i+1)}$ detection points on the right-position welding wire axis is the same as the ordinate value of the $L_{4i}$ detection point on the left-position welding wire axis. If ordinate positions of detection points (such as $L_{1(i+1)}$ and $L_{2(i+1)}$ detection points) in next detection exceed the range of the image capture window to ensure the ordinate values to be the same as the ordinate values of the same-type detection points in the current detection, adjustment is performed so that the weld seam deviation is detected only once in one arc movement (shaking or rotating) cycle in next weld seam deviation detection, and then, twice detection of the weld seam deviation in one arc movement cycle may be recovered. In addition, the final detection value of the distance $L_{1i}$, $L_{4i}$ or $L_{1(i+1)}$ from the welding wire position detection point to the left boundary of the global image is a median or a mean of detection values at m (m≥1) different positions that are on the axis of the welding wire 7 and in the welding wire left image capture window 18 or welding wire right image capture window 19; the final detection value of the distance $L_{2i}$, $L_{3i}$ or $L_{2(i+1)}$ from the groove edge to the left boundary of the global image is a median or a mean of detection values at k (k≥1) different positions that are on the groove edge line 21 or 22 and in the groove left image capture window 17 or groove right image capture window 20.

In one arc movement cycle, two complete welding images can be obtained. Therefore, by means of detection of two adjacent welding images, the weld seam deviation can be detected twice (excluding initial detection) in one arc movement (shaking or rotating) cycle, thus improving the real-time performance of the weld seam deviation detection. In addition, an image of a groove edge region away from the arc side is captured by using the small window and is processed, so that interference from the moving arc can be effectively avoided, thus improving the sensing detection precision of the weld seam deviation.

Figure 10:
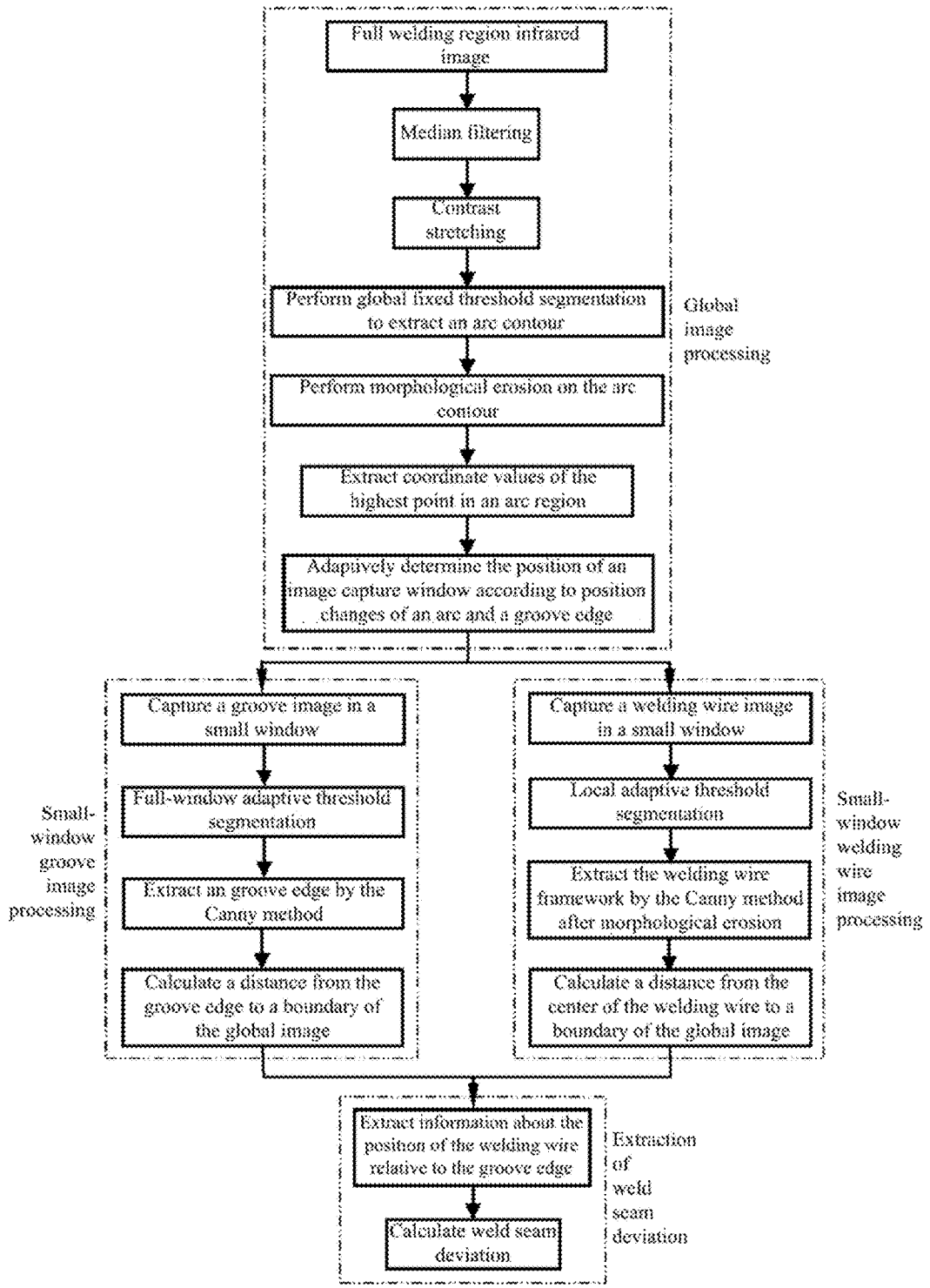
FIG. 10 is a flowchart of weld seam deviation detection in FIG. 1.

Image processing is the key to the weld seam deviation detection, and as shown in FIG. 10, the procedure of the image processing for weld seam deviation detection mainly includes the following four steps:

A) Global image processing is performed on the whole welding region infrared image, and the position of the image capture window is determined. Specifically, this step includes: 1. Image filtering processing: smooth filtering is performed, with a median method, on the whole real-time welding image acquired by the digital infrared camera 11, to reduce image noise caused by the arc light, spattering, smoke, and external environment interference during welding. 2. Image contrast stretching: piecewise linear transformation is performed on the gray scale of the input image by means of image gray value analysis, to compress the gray scale of the background region and improve the pixel gray value of the weld pool part and the arc part, thus increasing the contrast at the image boundary between the groove side wall and the weld pool, and the image boundary between the welding wire and the weld pool, so that the image contrast is stretched to prepare for the subsequent threshold segmentation. 3. Global image threshold segmentation: fixed threshold segmentation is performed on the global image, that is, the image including different gray levels is converted into a binary image, to simplify the hierarchy of the image and highlight the contour of the arc region. 4. Extraction of the highest point of the arc region: morphological erosion is performed on the contour of the arc, to eliminate the influence from a reflective region at the end of the welding wire, the morphological contour of the arc is extracted, and it is obtained through calculation that coordinate values of the highest point $C_1$ or $C_2$ of the arc region are $(X_{C1i}, Y_{C1i})$ or $(X_{C2i}, Y_{C2i})$. 5. Adaptive correction of the position of the image capture window: according to the ordinate value of the highest point $C_1$ or $C_2$ of the arc region, it is determined that the ordinate value of the positioning point $D_{1i}$ or $D_{2i}$ of the welding wire image capture window 18 or 19 is $(Y_{C1i}+\Delta Y)$ or $(Y_{C2i}+\Delta Y)$, where $\Delta Y$ is an additional adjustment quantity; meanwhile, according to the change in the abscissa value of the highest point $C_1$ or $C_2$ of the arc, the abscissa value $X_{d1i}$ or $X_{d2i}$ of the positioning point $D_{1i}$ or $D_{2i}$ of the welding wire image capture window 18 or 19 may be adaptively corrected (for a specific algorithm, refer to the following description); according to the change in the horizontal position of the groove edge line 21 or 22, the abscissa value $X_{b1i}$ or $X_{b2i}$ of the positioning point $B_{1i}$ or $B_{2i}$ of the groove edge image capture window 17 or 20 is adaptively corrected (for a specific algorithm, refer to the following description), so as to improve the environment adaptability and operation reliability of the infrared vision sensing detection method.

B) The small-window groove image is processed, to extract narrow-gap groove edge position information. Specifically, this step includes: 1. Determining of a position where the arc 1 is closest to the side wall of the groove 9: it is distinguished or determined, by using the position signal $P_L$ or $P_R$ input to the computer image processing system 15 when the arc moves to the left or right side wall of the groove or according to the abscissa value $X_{C1i}$ or $X_{C2i}$ of the highest point $C_1$ or $C_2$ of the arc region, whether the arc moves to a position closest to the left side wall of the groove or the right side wall of the groove currently. 2. Groove image capture: in the global welding image on which median filtering and contrast stretching processing have been performed in step A), an image of a region of a groove left side wall edge 21 or right side wall edge 22 away from the arc side is captured by using the small window 17 or 20, to reduce the image processing workload of the computer image processing system 15, and also avoid interference from the moving arc on the groove image detection. 3. Adaptive threshold segmentation of the full-window image: gray scale analysis is performed on the captured full-window groove image, to automatically search for a peak point and a valley point of the gray scale distribution of the weld pool image and the background image, and after a threshold point is determined, adaptive threshold segmentation is performed on the full-window groove image by using an Otsu method (Digital Image Processing, Third Edition, translated by Ruan Qiuqi, et al., Publishing House of Electronics Industry, 2011, Page 479), such that black-white binary processing is performed on the image, to highlight the groove edge. 4. Extraction of the groove edge: after smoothing and filtering processing is performed, by using a Canny edge operator (Feature Extraction & Image Processing for Computer Vision, Second Edition, translated by Li Shiying et al., Publishing House of Electronics Industry, 2013, Page 103), on the window image on which the adaptive threshold segmentation processing has been performed, so as to remove noise, a position where the weld pool and background image gray scale has a change is detected, and an edge line 21 or 22 between the weld pool and the side wall of the groove is extracted in the small window. 5. Extraction of the distance from the groove edge to the left boundary of the global image: the current distance $L_{2i}$ or $L_{2(i+1)}$ from the groove left edge 21 to the left boundary of the global image, or the current distance $L_{3i}$ from the groove right edge 22 to the left boundary of the global image is calculated.

C) The small-window welding wire image is processed, to extract welding wire position information. Specifically, this step includes: 1. Welding wire image capture: in the global welding image on which median filtering and contrast stretching processing have been performed in step A), a welding wire image is captured by using the small window 18 or 19. 2. Local adaptive threshold segmentation of the welding wire image: according to the feature that the gray value varies a lot between the upper and lower parts of the welding wire image, by using a local adaptive threshold segmentation method (Digital Image Processing, Third Edition, translated by Ruan Qiuqi, et al., Publishing House of Electronics Industry, 2011, Page 83), binary processing is performed on local images in different neighborhoods successively based on neighborhood gray scale analysis on each pixel of the captured image, to finally implement black-white binary processing on the full-window image, so as to enhance the local image feature of the welding wire. 3. Morphological erosion on the welding wire contour image: the welding wire contour image after the local threshold segmentation is processed by means of morphological erosion, to eliminate image noise and highlight the contour of the welding wire. 4. Extraction of the welding wire framework: in the welding wire contour image after the morphological erosion, the framework edge line of the welding wire is extracted in the small window by using a Canny edge operator. 5. Calculation of the distance from the center of the welding wire to the left boundary of the global image: the axis of the welding wire is extracted according to the framework of the welding wire, and the current distance $L_{1i}$ or $L_{1(i+1)}$ from the center of the welding wire 5 to the left boundary of the global image is extracted on the detection line 23, or the current distance current distance $L_{4i}$ from the center of the welding wire 5 to the left boundary of the global image is extracted on the detection line 24.

D) Calculation of weld seam deviation information. The current distance $X_{1i}$ or the next distance $X_{1(i+1)}$ from the right position detection point of the welding wire to the groove left edge 21 is calculated according to the formula $X_{1i}=(L_{1i}-L_{2i})$ or $X_{1(i+1)}=(L_{1(i+1)}-L_{2(i+1)})$, and the current distance $X_{2i}$ from the left position detection point of the welding wire to the groove right edge 22 is calculated according to the formula $X_{2i}=(L_{3i}-L_{4i})$. Then, the current detection value $\Delta X_{1i}$ or next detection value $\Delta X_{1(i+1)}$ of the weld seam deviation is calculated according to the formula $\Delta X_i=(X_{1i}-X_{2i})/2$ or $\Delta X_{(i-1)}(X_{1(i+1)}-X_{2i})/2$. Next, a median or a mean of the latest n detection values of the weld seam deviation is output as the current sampling value $\Delta X_{si}$ or next sampling value $\Delta X_{s(i+1)}$ of the weld seam deviation.

In the weld seam deviation detection procedure shown in FIG. 10, if the order of step B) and step C) is reversed, the detection result is not affected. Moreover, a specific algorithm for adaptive correction on the abscissa value of the position of the image capture small window is described as follows:

1) Adaptive correction algorithm for the abscissa value of the positioning point $D_{1i}$ or $D_{2i}$ of the welding wire image capture window: the abscissa value $X_{d1i}$ or $X_{d2i}$ of the positioning point $D_{1i}$ or $D_{2i}$ of the welding wire image capture window 18 or 19 is equal to a sum of the previously set value $X_{d1(i-1)}$ or $X_{d2(i-1)}$ and a variation $(X_{C1i}-X_{C1(i-1)})$ or $(X_{C2i}-X_{C2(i-1)})$ between the latest two detection values of the abscissa positions of the highest point $C_1$ or $C_2$ of the arc, that is, $X_{d1i}=X_{d1(i-1)}+(X_{C1i}-X_{C1(i-1)})$ or $X_{d2i}=X_{d2(i-1)}+(X_{C2i}-X_{C2(i-1)})$.

2) Adaptive correction algorithm for the abscissa value of the positioning point $B_{1i}$ or $B_{2i}$ of the groove edge image capture window: the abscissa value $X_{b1i}$ or $X_{b2i}$ of the positioning point $B_{1i}$ or $B_{2i}$ of the groove edge image capture window 17 or 20 is equal to a sum of the previously set value $X_{b(i-1)}$ or $X_{b2(i-1)}$ and a variation $(L_{2(i-1)}-L_{2(i-2)})$ or $(L_{3(i-1)}-L_{3(i-2)})$ between the latest two detection values of the position of the groove edge line 21 or 22, that is, $X_{b1i}=X_{b1(i-1)}+(L_{2(i-1)}-L_{2(i-2)})$ or $X_{b2i}=X_{b2(i-1)}+L_{3(i-1)}-L_{3(i-2)})$.

The following provides two embodiments of the sensing detection method for weld seam deviation according to the present invention.

Embodiment 1 (Using Shaking Arc Direct Current Welding as an Example)

FIG. 11 is an instance diagram of a welding wire axis position information extraction effect during direct current welding. The test conditions include: the digital CMOS infrared camera 11 works in an external triggering manner and has a camera angle of 25°, an aperture of 16, and an exposure time of 2 ms; the narrow bandpass filter has a central wavelength of 970 nm and a bandwidth of 25 nm; the transmittance of the neutral dimmer is 10%; welding is performed at a downhand position by using a direct current, the arc current is 280 A, the arc voltage is 29 V, the welding speed $V_w$=20.3 cm/min, the wire extension is 18 mm, the diameter of the welding wire is 1.2 mm, the flow rate of the welding shielding gas Ar+20% $CO_2$ is 30 L/min, and the I-type low-carbon steel welding groove gap is 13 mm. At the time point corresponding to FIG. 11, the welding torch is deviated leftwards (or the weld seam is deviated rightwards) by 0.5 mm; the arc shaking frequency is 2.5 Hz, the shaking radius r=6.5 mm, the shaking angle α=70°, and the arc stops at $A_{1i}$ and $A_{2i}$ on two side walls of the groove for 100 ms respectively.

Part (a) and part (b) of FIG. 11 are respectively global welding images obtained by the computer image processing system 15 at the time point when the arc 1 shakes to and stops at the left side wall and right side wall of the groove. It can be seen that the welding wire and the arc are closer to the left side wall of the groove, indicating that the welding torch is deviated leftwards, that is, the weld seam is deviated rightwards relative to the welding torch (corresponding to the case shown in FIG. 4). After fixed threshold segmentation (the threshold point gray value is 240) and morphological erosion are performed on the global welding images when the arc stops at the left and right side walls of the groove, obtained arc morphological images are as shown in part (c) and part (d) of FIG. 11. In the global welding images on which median filtering and contrast stretching processing have been performed, at positions shown by the white-line blocks on the welding wires in part (a) and part (b) of FIG. 11 (the position is adaptively determined according to the highest point $C_1$ or $C_2$ of the arc region, where the ordinate value additional adjustment quantity ΔY=10 pixels, so as to effectively avoid interference from the arc), the small-window images of the welding wire region captured by the welding wire left image capture window 19 and the welding wire right image capture window 18 are as shown in part (e) and part (f) of FIG. 11; after local adaptive threshold segmentation processing is performed on the captured small-window images of the welding wire region, obtained images of the welding wire region are as shown in part (g) and part (h) of FIG. 11, where the white regular region represents the contour of the welding wire. Morphological erosion is performed on the welding wire contour images on which the local threshold segmentation processing has been performed, and obtained welding wire contour images are as shown in part (j) and part (k) of FIG. 11. It can be seen that, affected by the interference from the arc light, the extracted contour of the welding wire is thick in the upper part and thin in the lower part. Welding wire contour edge (that is, the welding wire framework) images extracted by using the Canny edge operator are as shown by the white lines in part (m) and part (n) of FIG. 11. The geometric centers of the welding wire contours obtained by means of edge extraction are calculated, and obtained images of the axis positions are as shown in part (u) and part (v) of FIG. 11.

Figure 12:
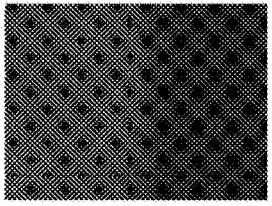
FIG. 12 is an instance diagram of a groove edge information extraction effect during direct current welding.

FIG. 12 is an instance diagram of a groove edge information extraction effect corresponding to the case shown in FIG. 11. In the global welding images on which median filtering and contrast stretching processing have been performed, at positions shown by the white-line blocks on the groove edge in part (a) and part (b) of FIG. 11, the small-window images of the groove edge region captured by the groove right image capture window 20 and the groove left image capture window 17 are as shown in part (a) and part (b) of FIG. 12. After full-window adaptive threshold segmentation processing is performed on the captured small-window images by using the Otsu method, obtained groove edge region images are as shown in part (c) and part (d) of FIG. 12, where the white region represents a weld pool region. Groove edge images extracted by using the Canny edge operator are as shown by the white lines in part (e) and part (f) of FIG. 12.

Finally, according to the weld seam deviation detection principle and algorithm as shown in FIG. 8 and FIG. 9, at or above a position with half height of the welding wire image capture window 18 or 19, a median of detection values on 5 (that is, m=5) different positions at intervals of 4 pixels on the axis of the welding wire 5 (referring to part (u) and part (v) of FIG. 11) is used as the current distance $L_{1i}$ or $L_{4i}$ from the center of the welding wire to the left boundary of the global image. Moreover, at or above a position with half height of the groove edge image capture window 17 or 20, a median of detection values on 3 (that is, k=3) different positions at intervals of 10 pixels on the groove edge line (referring to part (e) and part (f) of FIG. 12) is used as the current distance $L_{2i}$ or $L_{3i}$ from the groove edge 21 or 22 to the left boundary of the global image. After the current detection value $\Delta X_i$ of the weld seam deviation is calculated, a mean of the latest 5 (that is, n=5) detection values of the weld seam deviation is used as the current sampling value $\Delta X_{si}$ of the weld seam deviation, and it is resolved that $\Delta X_{si}$=0.41 mm (absolute detection error <0.1 mm), and meanwhile, $\Delta X_{si}$>0, indicating that the weld seam is deviated rightwards (or the welding torch is deviated leftwards).

In addition, under the same test condition for direct current arc welding, in the case where the actual deviation of the weld seam changes continuously in the range of ±1.0 mm, the absolute error of the sampling value $\Delta X_{si}$ of the weld seam deviation is less than ±0.15 mm, which further proves the effectiveness of the proposed infrared vision sensing detection method for weld seam deviation.

Embodiment 2 (Using Shaking Arc Pulsed Welding as an Example)

Figure 13:
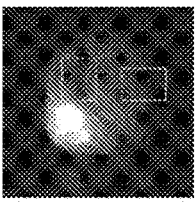
FIG. 13 is an instance diagram of a welding wire axis position information extraction effect during pulsed welding.

FIG. 13 is an instance diagram of a welding wire axis position information extraction effect during pulsed welding. Test conditions include: the transmittance of the neutral dimmer is 30%, the digital infrared CMOS camera works in an external triggering manner, welding is performed using a pulsed MAG arc, an average welding current is 280 A, an average arc voltage is 29 V, and the welding torch is deviated rightwards (or the weld seam is deviated leftwards) 0.6 mm; other test conditions are the same as conditions in FIG. 11.

When the arc shakes to a position close to a side wall of the groove, a signal $P_L$ where the arc stops at the left side wall of the groove or a signal $P_R$ where the arc stops at the right side wall of the groove is valid. In this case, once the arc current sensor 13 detects that the first base value period current signal $i_b$ of the pulsed arc 1 arrives, the infrared camera 11 is triggered immediately to acquire a welding region image with smallest interference from the arc light. Correspondingly, pulsed welding global images obtained by the computer image processing system 15 when the arc shakes to the left side wall and the right side wall of the groove are as shown in part (a) and part (b) of FIG. 13. It can be seen that, the welding wire and the arc are closer to the right side wall of the groove, indicating that the welding torch is deviated rightwards (or the weld seam is deviated leftwards relative to the welding torch, corresponding to the case shown in FIG. 3). In addition, the arc in the pulse base value period is relatively small (though a dimmer with greater transmittance is used), so that interference from the arc light is reduced. Part (c) and part (d) of FIG. 13 show arc morphological images after fixed threshold segmentation and morphological erosion are performed on the global image. In the global pulsed welding images on which median filtering and contrast stretching processing have been performed, at positions shown by the white-line blocks on the welding wires in part (a) and part (b) of FIG. 13 (the position is adaptively determined according to the highest point $C_1$ or $C_2$ of the arc region), the small-window images of the welding wire region captured by the welding wire image capture windows 19 and 18 are as shown in part (e) and part (f) of FIG. 13. After local adaptive threshold segmentation processing is performed on the captured small-window images of the welding wire region, obtained images of the welding wire region are as shown in part (g) and part (h) of FIG. 13, where the white regular region represents the contour of the welding wire. Morphological erosion is performed on the welding wire contour images on which the local threshold segmentation processing has been performed, and obtained welding wire contour images are as shown in part (j) and part (k) of FIG. 13. Welding wire contour edge (that is, the welding wire framework) images extracted by using the Canny edge operator are as shown by the white lines in part (m) and part (n) of FIG. 13. The geometric centers of the welding wire contours obtained by means of edge extraction are calculated, and obtained images of the axis positions are as shown in part (u) and part (v) of FIG. 13.

Figure 14:
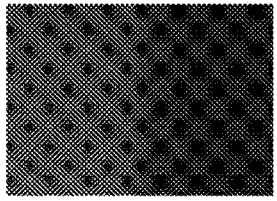
FIG. 14 is an instance diagram of a groove edge information extraction effect during pulsed welding.

FIG. 14 is an instance diagram of a groove edge information extraction effect corresponding to the case shown in FIG. 13. In the pulsed welding global images on which median filtering and contrast stretching processing have been performed, at positions shown by the white-line blocks on the groove edge in part (a) and part (b) of FIG. 13, the small-window images of the groove edge region captured by the groove image capture windows 20 and 17 are as shown in part (a) and part (b) of FIG. 14. After full-window adaptive threshold segmentation processing is performed on the captured small-window images by using the Otsu method, obtained groove edge region images are as shown in part (c) and part (d) of FIG. 14, where the white region represents a weld pool region. Groove edge images extracted by using the Canny edge operator are as shown by the white lines in part (e) and part (f) of FIG. 14.

Finally, according to the weld seam deviation detection principle and algorithm as shown in FIG. 8 and FIG. 9, at or above a position with half height of the welding wire image capture window 18 or 19, a median of detection values on 5 different positions at intervals of 4 pixels on the axis of the welding wire 5 (referring to part (u) and part (v) of FIG. 13) is used as the current distance $L_{1i}$ or $L_{4i}$ from the center of the welding wire to the left boundary of the global image. Moreover, at or above a position with half height of the groove edge image capture window 17 or 20, a median of detection values on 3 different positions at intervals of 10 pixels on the groove edge line (referring to part (e) and part (f) of FIG. 14) is used as the current distance $L_{2i}$ or $L_{3i}$ from the groove edge 21 or 22 to the left boundary of the global image. After the current detection value $\Delta X_i$ of the weld seam deviation is calculated, a mean of the latest 5 detection values of the weld seam deviation is used as the current sampling value $\Delta X_{si}$ of the weld seam deviation, and it is resolved that $\Delta X_{si}$=−0.65 mm (the minus sign represents that the weld seam is deviated leftwards), and a detection absolute error is 0.05 mm.

In addition, under the same test condition for pulsed arc welding, in the case where the actual deviation of the weld seam changes continuously in the range of ±1.0 mm, the absolute error of the sampling value $\Delta X_{si}$ of the weld seam deviation is less than ±0.15 mm, which further proves the effectiveness of the weld seam detection method synchronized with the pulse base value.

What is claimed is:

1. An infrared vision sensing detection device for narrow-gap weld seam deviation, comprising a narrow-gap welding torch, an arc current sensor, a computer image processing system, and an infrared photographing system, wherein one end of a bent conducting rod in the narrow-gap welding torch is connected to a motor driving and a feeding mechanism, and the other end is connected to a straight-type contact tube, a welding wire passing through the narrow-gap welding torch extends into a groove to be welded to generate a welding arc, and the infrared photographing system comprises a digital infrared camera and an infrared filtering system, wherein:

the computer image processing system comprises an image acquisition card, a welding wire position information extraction module and a weld seam deviation value calculation module that are sequentially connected, and the image acquisition card is connected to the infrared camera through a video line, a signal $P_L$ or $P_1$ is input to the infrared camera and the image acquisition card simultaneously when the arc generated by the motor driving and the feeding mechanism moves to a position closest to the left or right side wall of the groove, one end of the welding power source is connected to the motor driving and the feeding mechanism, a connection cable on the other end passes through a detection ring of the arc current sensor or is connected in series with the arc current sensor, and then is connected to a workpiece, a pulsed welding arc base value current signal $i_b$ detected by the arc current sensor and the arc position signal $P_L$ or $P_R$ jointly act on an image photographing trigger signal input end of the infrared camera.

2. A detection method of the infrared vision sensing detection device for narrow-gap weld seam deviation according to claim 1, comprising the following steps:

1) the entire narrow-gap welding torch and the infrared photographing system moving towards the front of the groove at a welding speed $V_w$ together, triggering, according to the arc position signal $P_L$ or $P_R$, the infrared camera to acquire a welding region image at this time point and send the welding region image to the computer image processing system through the image acquisition card;
2) when the arc moves to a position closest to the left or right side wall of the groove, the welding wire position information extraction module receiving a welding image information from the image acquisition card, extracting, by processing the welding region image, a current distance $X_{1i}$ from a right position detection point of the welding wire to a groove left edge and a current distance $X_{2i}$ from a left position detection point of the welding wire to a groove right edge, and sending the current distances to the weld seam deviation value calculation module; and
3) the weld seam deviation value calculation module calculating a current detection value $\Delta X_i$ of the weld seam deviation according to the formula $\Delta X_i=(X_{1i}-X_{2i})/2$, and then using a median or a mean of the latest n (n≥1) detection values of the weld seam deviation as a current sampling value $\Delta X_{si}$ of the weld seam deviation, wherein if $\Delta X_{si}=0$, then the weld seam is not deviated, if $\Delta X_{si}>0$, then the welding wire is deviated towards the right side of the groove, and if $\Delta X_{si}<0$, then the welding wire is deviated towards the left side of the groove.

3. The detection method according to claim 2, wherein in step 2), when the arc moves to the position closest to the right side wall of the groove, the welding wire position information extraction module adjusts an abscissa value of a positioning point $B_{1i}$ of a groove left image capture window according to a horizontal position change of a groove left edge line, to capture a groove left image without interference from the arc; after the groove left edge is extracted, a current distance $L_{2i}$ from the groove left edge to a left boundary of a global image is calculated; after a welding wire right position image is captured in a welding wire right image capture window, a current distance $L_{1i}$ from a center of the welding wire to the left boundary of the global image is extracted, to calculate a current distance from the right position detection point of the welding wire to the groove left edge: $X_{1i}=(L_{1i}-L_{2i})$; when the arc moves to a position closest to a left side wall of the groove, the welding wire position information extraction module adjusts an abscissa value of a positioning point $B_{2i}$ of a groove right image capture window according to a horizontal position change of a groove right edge line, to capture a groove right image without interference from the arc; after the groove right edge is extracted, a current distance $L_{3i}$ from the groove right edge to the left boundary of the global image is calculated; after a welding wire left position image is captured in a welding wire left image capture window, a current distance $L_{4i}$ from the center of the welding wire to the left boundary of the global image is extracted, to calculate a current distance from the left position detection point of the welding wire to the groove right edge: $X_{2i}=(L_{3i}-L_{4i})$.

4. The detection method according to claim 3, wherein the current distance $L_{1i}$ or $L_{4i}$ from the center of the welding wire to the left boundary of the global image is extracted first, and then the current distance $L_{2i}$ or $L_{3i}$ from the groove left or right edge to the left boundary of the global image is calculated.

5. The detection method according to claim 2, wherein when the arc moves to the position closest to the right side wall of the groove again, a next distance $L_{2(i+1)}$ from the groove left edge to the left boundary of the global image and a next distance $L_{1(i+1)}$ from the right position detection point of the welding wire to the left boundary of the global image are extracted first, and then a next distance from the right position detection point of the welding wire to the groove left edge is calculated: $X_{1(i+1)}=(L_{1(i+1)}-L_{2(i+1)})$, thereby calculating a next detection value of the weld seam deviation: $\Delta X_{(i+1)}=(X_{1(i+1)}-X_{2i})/2$, and so forth, so that the weld seam deviation is detected twice in one arc movement cycle.

6. The detection method according to claim 3, wherein ordinate values of the $L_{2i}$ and $L_{2(i+1)}$ detection points on the groove left edge line are the same as an ordinate value of the $L_{3i}$ detection point on the groove right edge line, ordinate values of the $L_{1i}$ and $L_{1(i+1)}$ detection points on the right-position welding wire axis are the same as an ordinate value of the $L_{4i}$ detection point on the left-position welding wire axis, a final detection value of the distance $L_{1i}$, $L_{4i}$ or $L_{1(i+1)}$ from the welding wire position detection point to the left boundary of the global image is a median or a mean of detection values of m (m≥1) different positions that are in the welding wire image left and right capture windows and on the axis of the welding wire, and a final detection value of the distance $L_{2i}$, $L_{3i}$ or $L_{2(i+1)}$ from the groove left and right edges to the left boundary of the global image is a median or a mean of detection values at k (k≥1) different positions that are in the groove left and right image capture windows and on the groove left and right edge lines.

7. The detection method according to claim 2, wherein:
when the welding region image is processed, coordinate values of a highest point in an arc region are first extracted by means of global welding image processing, and coordinate values of positioning points of the welding wire left and right image capture windows are adjusted according to a change in the coordinate position of the highest point of the arc region;
a small-window groove image captured by the groove left and right image capture windows and a small-window welding wire image captured by the welding wire left and right image capture windows are separately processed;
during processing of the small-window images captured by the welding wire left and right image capture windows, a local adaptive threshold segmentation processing is performed first, and after the contour of the welding wire is extracted by means of morphological erosion on a full-window image, the framework of the welding wire is extracted by using a Canny edge detection algorithm, and finally, the axis position of the welding wire is calculated.

8. The detection method according to claim 3, wherein in the case of shaking or rotating pulsed arc welding, when the arc moves to the position closest to the left side wall or a right side wall of the groove, once the current sensor detects that the first pulsed welding arc base value current signal $i_b$ of the pulsed arc arrives, the infrared camera is triggered immediately, so as to acquire a welding region image with smallest interference from arc light at this time point, thereby achieving welding image acquisition synchronized with a base value current period of the pulsed arc.

9. The detection method according to claim 3, wherein when the arc moves to the position closest to the right side wall of the groove again, a next distance $L_{2(i+1)}$ from the groove left edge to the left boundary of the global image and a next distance $L_{1(i+1)}$ from the right position detection point of the welding wire to the left boundary of the global image are extracted first, and then a next distance from the right position detection point of the welding wire to the groove left edge is calculated: $X_{1(i+1)}=(L_{1(i+1)}-L_{2(i+1)})$, thereby calculating a next detection value of the weld seam deviation: $\Delta X_{(i+1)}=(X_{1(i+1)}-X_{2i})/2$, and so forth, so that the weld seam deviation is detected twice in one arc movement cycle.

10. The detection method according to claim 8, wherein ordinate values of the $L_{2i}$ and $L_{2(i+1)}$ detection points on the groove left edge line are the same as an ordinate value of the $L_{3i}$ detection point on the groove right edge line, ordinate values of the $L_{1i}$ and $L_{1(i+1)}$ detection points on the right-position welding wire axis are the same as an ordinate value of the $L_{4i}$ detection point on the left-position welding wire axis, a final detection value of the distance $L_{1i}$, $L_{4i}$ or $L_{1(i+1)}$ from the welding wire position detection point to the left boundary of the global image is a median or a mean of detection values of m (m≥1) different positions that are in the welding wire image left and right capture windows and on the axis of the welding wire, and a final detection value of the distance $L_{2i}$, $L_{3i}$ or $L_{2(i+1)}$ from the groove left and right edges to the left boundary of the global image is a median or a mean of detection values at k (k≥1) different positions that are in the groove left and right image capture windows and on the groove left and right edge lines.

11. The detection method according to claim 3, wherein:

when the welding region image is processed, coordinate values of a highest point in an arc region are first extracted by means of global welding image processing, and coordinate values of positioning points of the welding wire left and right image capture windows are adjusted according to a change in the coordinate position of the highest point of the arc region;

a small-window groove image captured by the groove left and right image capture windows and a small-window welding wire image captured by the welding wire left and right image capture windows are separately processed;

during processing of the small-window images captured by the welding wire left and right image capture windows, a local adaptive threshold segmentation processing is performed first, and after the contour of the welding wire is extracted by means of morphological erosion on a full-window image, the framework of the welding wire is extracted by using a Canny edge detection algorithm, and finally, the axis position of the welding wire is calculated.

* * * * *